(12) United States Patent
Hanna et al.

(10) Patent No.: US 10,546,084 B1
(45) Date of Patent: Jan. 28, 2020

(54) SYSTEM, METHOD, AND COMPUTER PROGRAM PRODUCT FOR RANKING AND DISPLAYING VIOLATIONS IN AN ELECTRONIC DESIGN

(71) Applicant: Cadence Design Systems, Inc., San Jose, CA (US)

(72) Inventors: Nizar Hanna, Karmeil (IL); Maayan Ziv, Haifa (IL); Almothana Sarhan, Nahef (IL); Kanwar Pal Singh, Noida (IN); Rabin Shahav, Zichron Yaacov (IL)

(73) Assignee: Cadence Design Systems, Inc., San Jose, CA (US)

(*) Notice: Subject to any disclaimer, the term of this patent is extended or adjusted under 35 U.S.C. 154(b) by 58 days.

(21) Appl. No.: 15/833,332

(22) Filed: Dec. 6, 2017

(51) Int. Cl.
*G06F 17/50* (2006.01)
(52) U.S. Cl.
CPC ............................... *G06F 17/504* (2013.01)
(58) Field of Classification Search
CPC .................................................. G06F 17/504
USPC ............................................................ 716/106
See application file for complete search history.

(56) References Cited

U.S. PATENT DOCUMENTS

| | | | | |
|---|---|---|---|---|
| 7,689,399 B1* | 3/2010 | Hangal | ............ | G06F 17/504 703/14 |
| 8,739,092 B1* | 5/2014 | Ben-Tzur | ............ | G06F 17/5022 716/106 |
| 9,098,637 B1* | 8/2015 | Sahu | ............ | G06F 11/3692 |
| 9,208,451 B2* | 12/2015 | Katz | ............ | G06F 11/261 |
| 2016/0342720 A1* | 11/2016 | Veneris | ............ | G06F 17/5045 |
| 2017/0032058 A1* | 2/2017 | Arbel | ............ | G06F 17/5022 |
| 2018/0253512 A1* | 9/2018 | Green | ............ | G06N 20/00 |
| 2019/0005173 A1* | 1/2019 | Blair | ............ | G06F 17/5022 |

* cited by examiner

*Primary Examiner* — Suresh Memula
(74) *Attorney, Agent, or Firm* — Mark H. Whittenberger, Esq.; Holland & Knight LLP

(57) ABSTRACT

The present disclosure relates to a method for electronic design verification. Embodiments may include receiving, using at least one processor, an electronic design and performing formal verification upon at least a portion of the electronic design. Embodiments may further include identifying one or more violations associated with the formal verification and ranking the one or more violations, based upon, at least in part, one or more user-selectable variables. Embodiments may also include displaying, at a graphical user interface, the one or more violations in a ranked order.

17 Claims, 7 Drawing Sheets

| Incidence | Criticality | Dependency (grouping) | Complexity | Learning |
|---|---|---|---|---|
| Tag Based | Severity | Group size | Violation complexity | Waivers |
| Instance Based | Module Criticality | | | |
| | Influence | | | |
| | Tag Priority | | | |

SYSTEM, METHOD, AND COMPUTER PROGRAM PRODUCT FOR RANKING AND DISPLAYING VIOLATIONS IN AN ELECTRONIC DESIGN

FIELD OF THE INVENTION

The present disclosure relates to electronic design verification, and more specifically, to a method for ranking design violations in a manner that is most convenient for the electronic designer.

DISCUSSION OF THE RELATED ART

Formal verification relies upon a system of constraints to communicate the legal state space to the proof engines. One of the biggest problems designers face when working with register-transfer-level ("RTL") signoff tools is sorting through countless violations reported by the tools. Designers need to debug the violations and correct the RTL, all under a strict timeline.

Summary of Disclosure

In one or more embodiments of the present disclosure, a computer-implemented method for electronic design verification. The method may include receiving, using at least one processor, an electronic design and performing formal verification upon at least a portion of the electronic design. The method may further include identifying one or more violations associated with the formal verification and ranking the one or more violations, based upon, at least in part, one or more user-selectable variables. The method may also include displaying, at a graphical user interface, the one or more violations in a ranked order.

One or more of the following features may be included. In some embodiments, the one or more user-selectable variables include at least one of incidence across type and incidence across instance. Ranking may include applying a weight to each of the one or more user-selectable variables prior to the ranking. Displaying may include displaying at least one of an automatic formal properties view or a violation messages view. The one or more user-selectable variables may include at least one of waiver learning, group size, severity, and/or criticality. Ranking may be based upon, at least in part, at least two of the one or more user-selectable variables.

In one or more embodiments of the present disclosure a computer-readable storage medium having stored thereon instructions, which when executed by a processor result in one or more operations is provided. Operations may include receiving, using at least one processor, an electronic design and performing formal verification upon at least a portion of the electronic design. Operations may further include identifying one or more violations associated with the formal verification and ranking the one or more violations, based upon, at least in part, one or more user-selectable variables. Operations may also include displaying, at a graphical user interface, the one or more violations in a ranked order.

One or more of the following features may be included. In some embodiments, the one or more user-selectable variables include at least one of incidence across type and incidence across instance. Ranking may include applying a weight to each of the one or more user-selectable variables prior to the ranking. Displaying may include displaying at least one of an automatic formal properties view or a violation messages view. The one or more user-selectable variables may include at least one of waiver learning, group size, severity, and/or criticality. Ranking may be based upon, at least in part, at least two of the one or more user-selectable variables.

In one or more embodiments of the present disclosure, a system for electronic design verification is provided. The system may include a computing device having at least one processor configured to receive an electronic design and to perform formal verification upon at least a portion of the electronic design. The at least one processor may be further configured to identify one or more violations associated with the formal verification and to rank the one or more violations, based upon, at least in part, one or more user-selectable variables. The at least one processor may be further configured to display, at a graphical user interface, the one or more violations in a ranked order.

One or more of the following features may be included. In some embodiments, the one or more user-selectable variables may include at least one of incidence across type and incidence across instance. Ranking may include applying a weight to each of the one or more user-selectable variables prior to the ranking. Displaying may include displaying at least one of an automatic formal properties view or a violation messages view. The one or more user-selectable variables may include at least one of waiver learning, group size, severity, and/or criticality. Ranking may be based upon, at least in part, at least two of the one or more user-selectable variables.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 3 is a diagram depicting an embodiment in accordance with the present disclosure;

DETAILED DESCRIPTION

Figure 1:
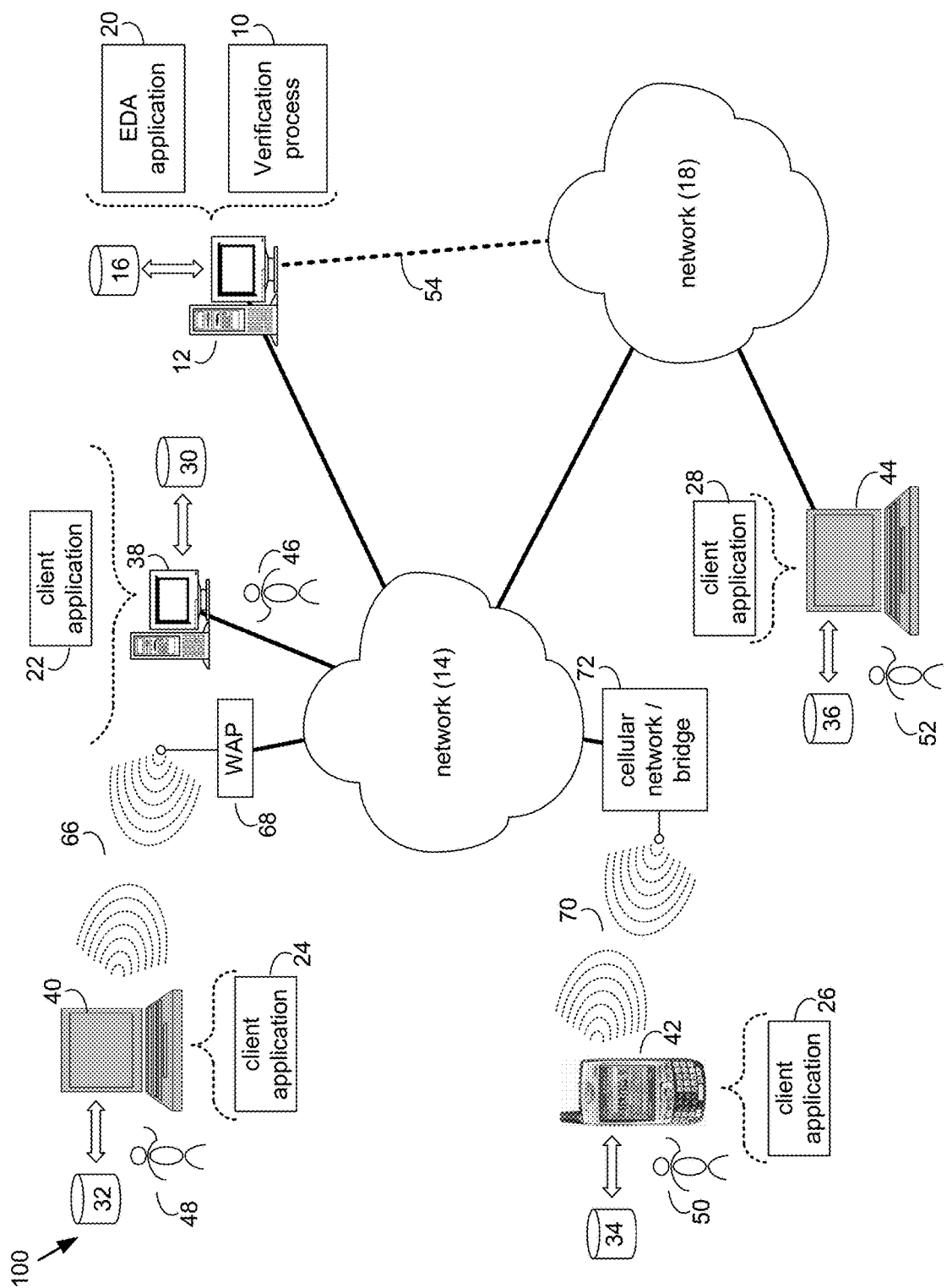
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a ranking process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, ranking process 10 may reside on and be executed, in whole or in part, by a client electronic device, such as a personal computer, notebook computer, personal digital assistant, or the like.

The instruction sets and subroutines of ranking process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Ranking process 10 may be a stand alone application, or may be an applet/application/script that may interact with and/or be executed within EDA application 20. In addition/as an alternative to being a server-side process, ranking process 10 may be a client-side process (not shown) that may reside on a client electronic device (described below) and may interact with an EDA client application (e.g., one or more of EDA client applications 22, 24, 26, 28). Further, ranking process 10 may be a hybrid server-side/client-side process that may interact with EDA application 20 and an EDA client application (e.g., one or more of client applications 22, 24, 26, 28). As such, ranking process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize ranking process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CMSA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
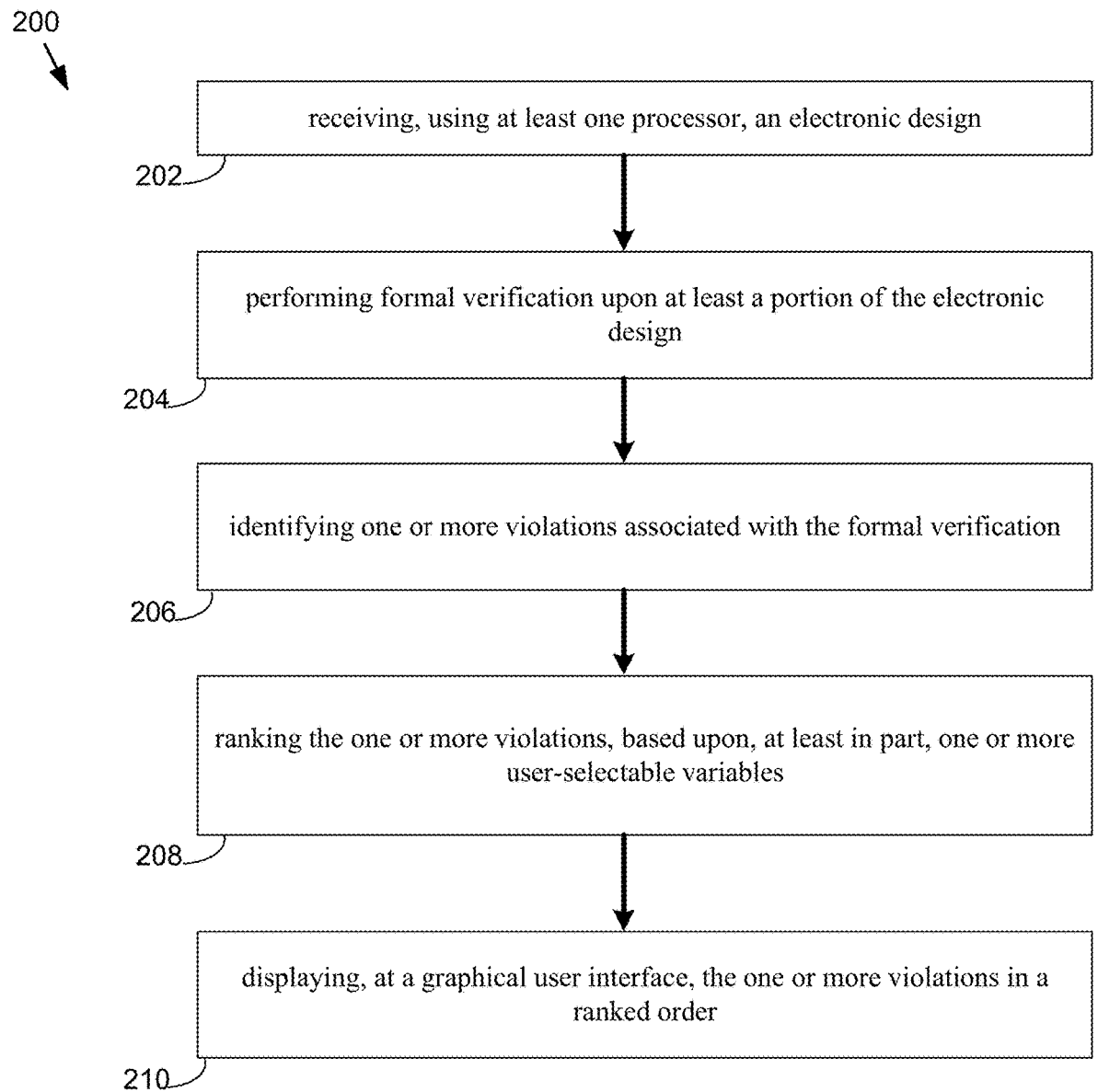
FIG. 2 is a flowchart depicting operations consistent with the ranking process in accordance with an embodiment of the present disclosure.

Referring now to FIG. 2, an exemplary flowchart 200 depicting operations consistent with ranking process 10 is provided. Operations may include receiving (202), using at least one processor, an electronic design and performing (204) formal verification upon at least a portion of the electronic design. Operations may further include identifying (206) one or more violations associated with the formal verification and ranking (208) the one or more violations, based upon, at least in part, one or more user-selectable variables. Operations may also include displaying (210), at a graphical user interface, the one or more violations in a ranked order.

As discussed above, one of the biggest problems designers face when working with register-transfer-level ("RTL") signoff tools is sorting through countless violations reported by the tools. Designers need to debug the violations and correct the RTL, all under a strict timeline. Embodiments included herein provide a ranking process 10 that may be configured to offer ranking and sorting of violations so the designers may be able to review any critical violations first.

Referring also to FIG. 3, embodiments of ranking process 10 may be configured to perform smart ranking wherein a ranking algorithm may be used which may depend on the design behavior (violations) and on the interactive work with the tool. Embodiments of ranking process 10 may introduce different variables that contribute to the ranking computation. Some of these may include, but are not limited to, tag or type based incidence, instance based incidence, severity, module criticality, influence on the design, tag priority, dependency—group size, violation complexity, learning from users' waivers, etc.

In some embodiments, incidence across type may refer to the number of violations of type A will impact the future ranking of violations of type A.

In some embodiments, incidence across instance may refer to the number of violation from instance M will impact the future ranking of violations from instance M.

In some embodiments, waiver learning may refer to a situation whereby if a user waives a violation, it will impact the ranking of other related violations (either from the same type or from the same instance).

In some embodiments, module criticality may refer to identifying critical RTL modules and then rank the violations from these modules higher than others. As an example, vectors may be used to identify the criticality. These may include depth of the module (e.g. Top module). The system may identify what the module represents, e.g. CPU module (by naming analysis).

In some embodiments, group size may refer to a dependent violation having a similar root cause might contribute for ranking such as higher. Additionally and/or alternatively, in some embodiments, the severity of the violation (e.g., error, warning, info, etc.) which may be set by the user might contribute for ranking the higher severity violation higher. In some embodiments, based on some heuristic ranking process 10 may be configured to set a level of influence for each violation on the design functionality which may contribute to ranking. Each rule (e.g., rule or tag is a check type) may include a static priority defined in the tool which also may take part of the final ranking of the violation.

In some embodiments, ranking process 10 may perform ranking based upon, at least in part, violation complexity. For example, for specific checks, each check may give weight to the specific check (e.g., OUTIND: Read (RHS) vs Write (LHS)). In this example, OUTIND may be a check for checking out of bound indexing and ranking according to this variable might be influenced if this violation happens with read (RHS) or write (LHS). It should be noted that violation complexity is yet another variable that may be included as part of ranking process 10. Any of the variables discussed herein may be inserted (e.g., as vi in the equation above). Embodiments of ranking process 10 include numerous other variables that contribute to the ranking algorithm.

In some embodiments, ranking process 10, may be based on the variables mentioned above, and a weight may be assigned to each variable. For example, ranking process 10 may be configured to match each variable to a value. These variable values influence the final ranking calculation associated to each violation. Each such variable may include its own rank and weight.

In some embodiments, ranking process 10 may use an equation of weighted variables giving each attribute a rank (e.g., within a range of (0-1). Attributes may be compared by comparing their rank value, however, numerous other approaches are also within the scope of the present disclosure. The final violation ranking may be determined using one or more equations to normalize the different variable ranking considering the weights of each.

An example ranking equation is provided below:

Let $V_c = \{v_i | v_i \in [0,1]\}_{i=0}^{n}$ be concrete variables set of ranking value.

Let $W_c = \{\omega_i | \omega_i \in [0,1]\}_{i=0}^{n}$, be the weights of each variable $\omega_i$ is the weight of $v_i | 0 \le i \le n \& \Sigma_{i=0}^{n} \omega_i^2 = 1$).

The Ranking of check would be:

$$R_c = \|\{v_i \times \omega_i\}_{i=0}^{n}\|_2 = (\Sigma_{i=0}^{n}(v_i \times \omega_i)^2)^{1/2}$$

$R_c \in [0,1]$ represents the distance of the vector $V_c$ from Zero (Origin).

for example:

$$V_{prop1} = (\{v_{Influence} = 1, v_{Module\ Criticality} = 0.5, v_{Group\ Size} = 0.2\}$$

$$W_{prop1} = \{(\omega_{Influence} = 1/3, \omega_{Module\ Criticality} = 2/3, \omega_{Group\ Size} = 2/3\}$$

$$R_{prop1} = \sqrt{(1 \times 1/3)^2 + (0.5 \times 2/3)^2 + (0.2 \times 2/3)^2)} = 0.65$$

In some embodiments, the ranking may also be based upon the violated check signal type (e.g., flop, output, latch, wire, etc.). Other options include ranking based upon, at least in part, bound, engine, formal, etc.

Referring also to FIGS. 4-7, embodiments of ranking process 10 depicting a plurality of graphical user interfaces ("GUIs") that may be used to display aspects of ranking process 10.

Figure 4:
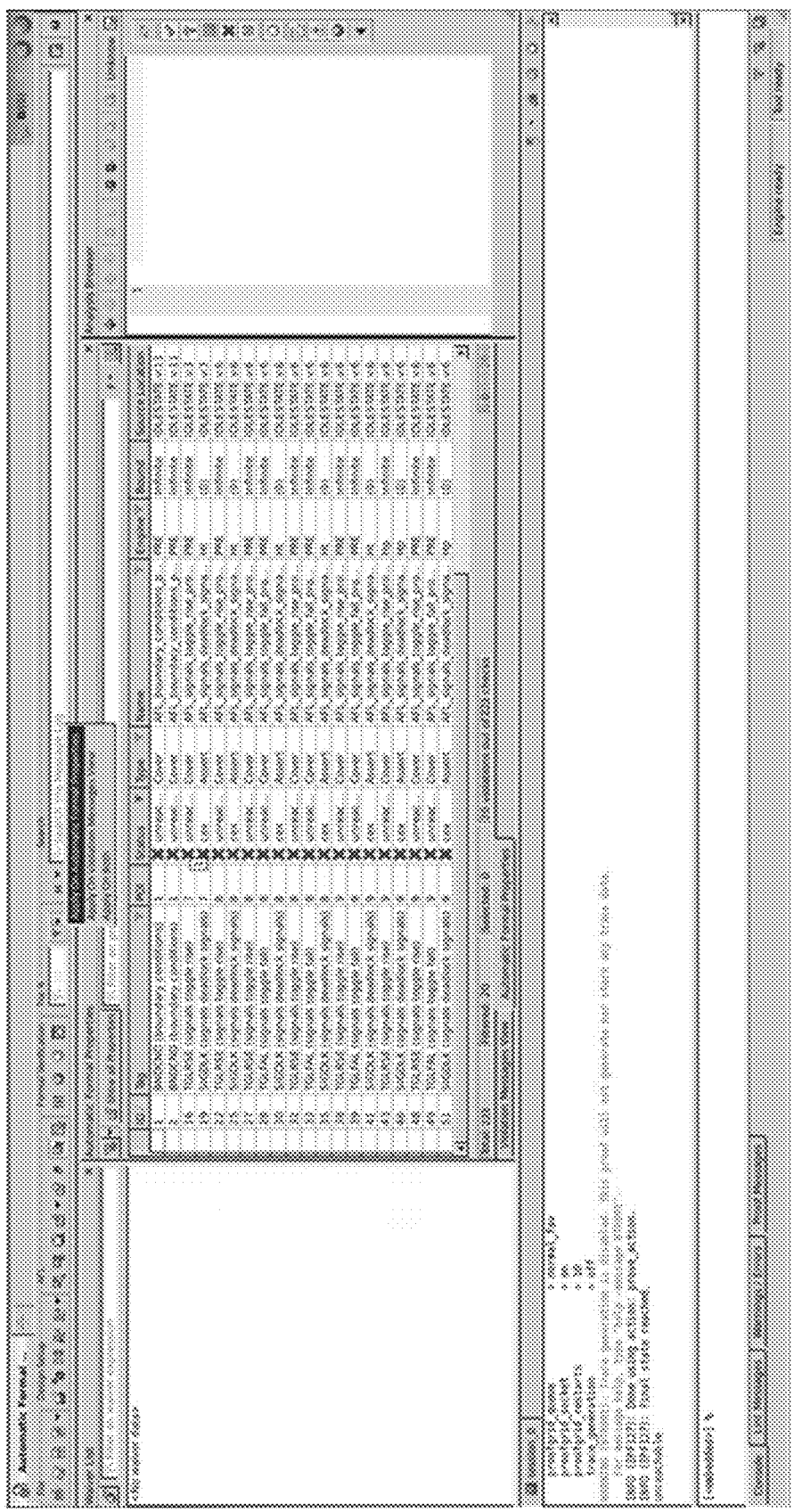
FIG. 4 is a diagram depicting an embodiment in accordance with the present disclosure.

FIG. 4 shows an example GUI 400 that displays an automatic formal properties viewing option. In operations, a user may select the top N properties (e.g., formal violations) and the view may be configured to order the violations based on the final ranking and shows the top N only.

Figure 5:
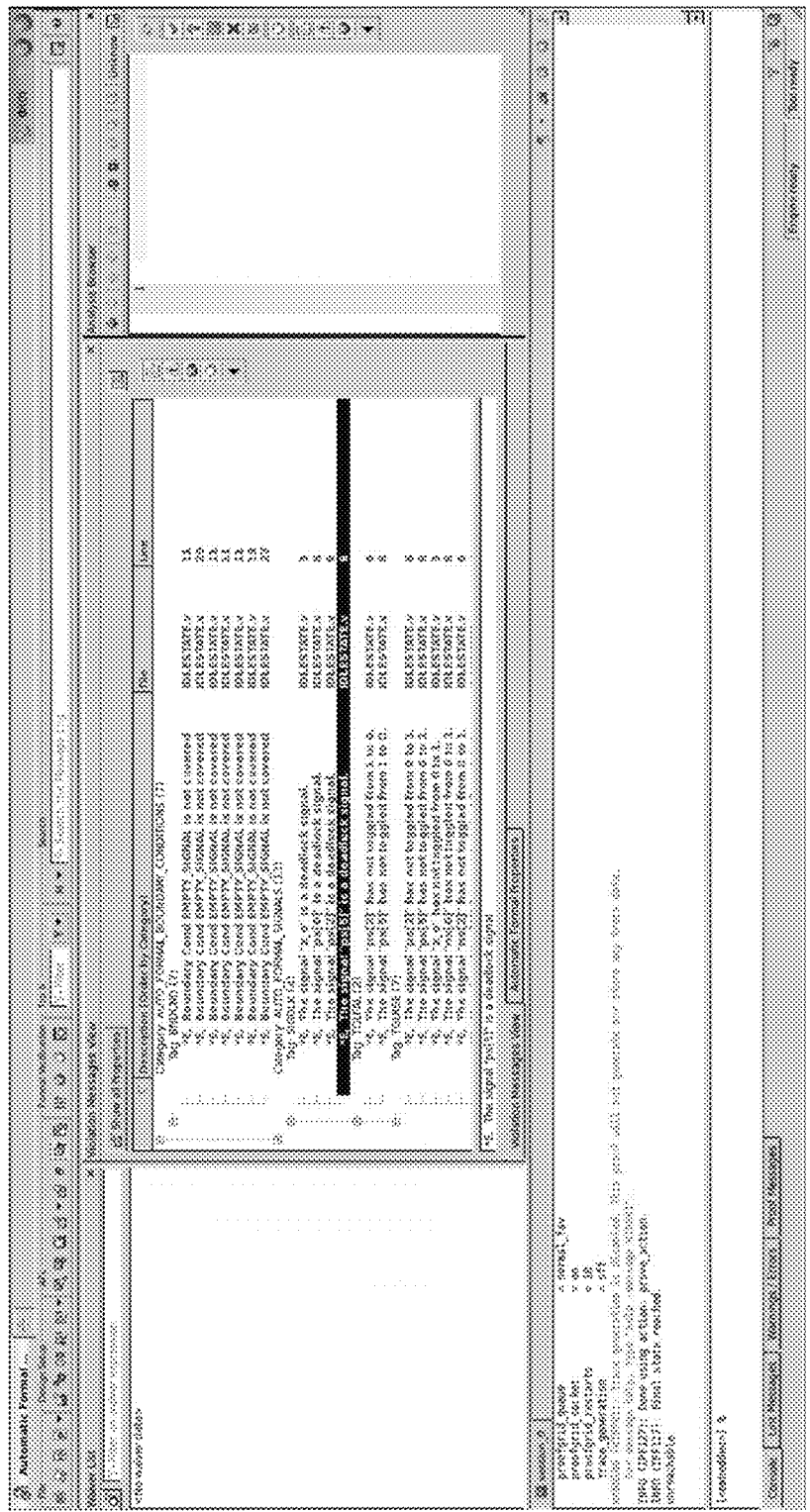
FIG. 5 is a diagram depicting an embodiment in accordance with the present disclosure.

FIG. 5 shows an example GUI 500 that displays a violation messages viewing option. Again, in operation, a user may select the top N properties (e.g., formal violations) and the view may be configured to order the violations based on the final ranking and show the top N only. However, this view may be used for violations including linting (e.g., basic linting DFT linting and formal) violations.

Figure 6:
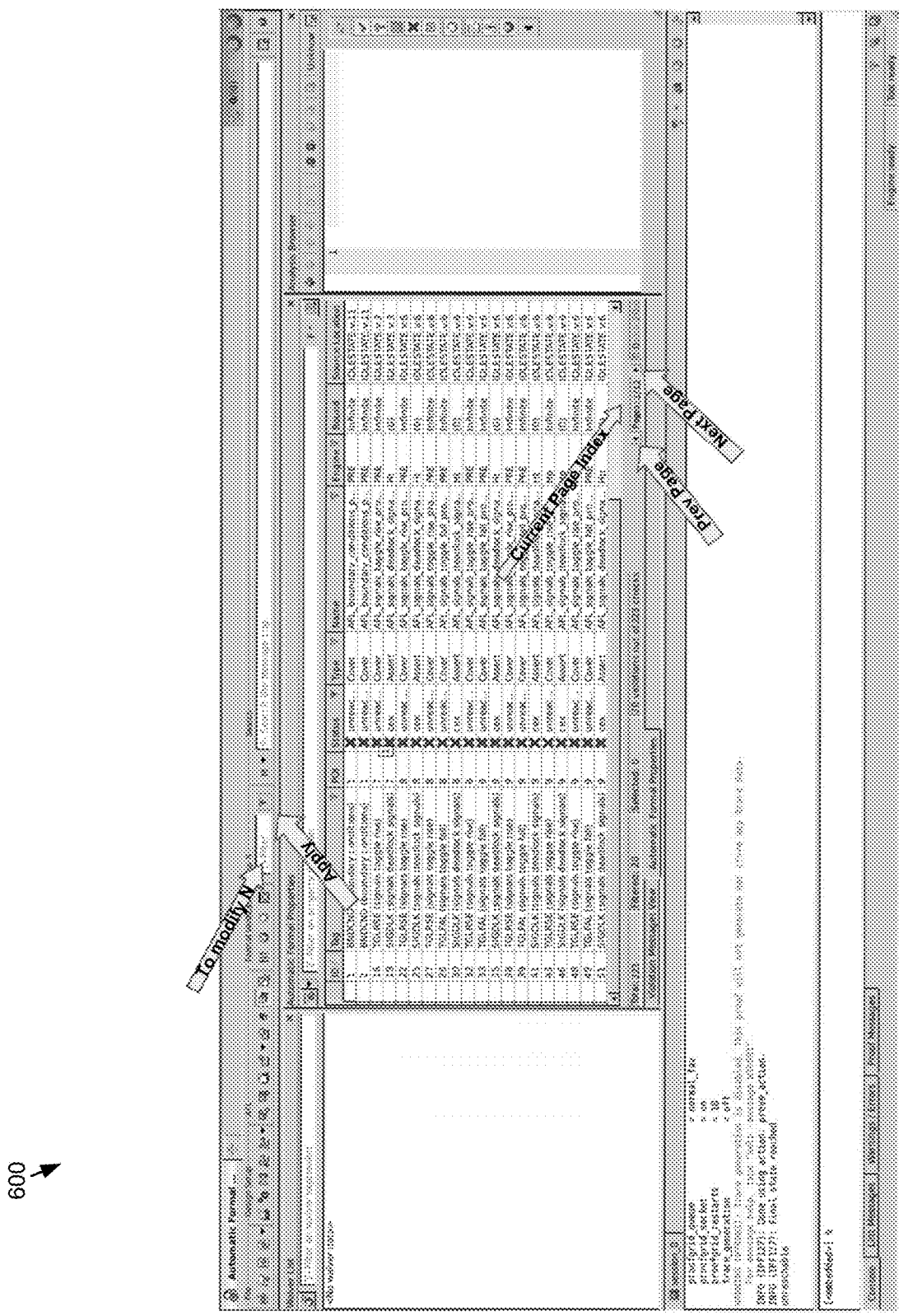
FIG. 6 is a diagram depicting an embodiment in accordance with the present disclosure.
Figure 7:
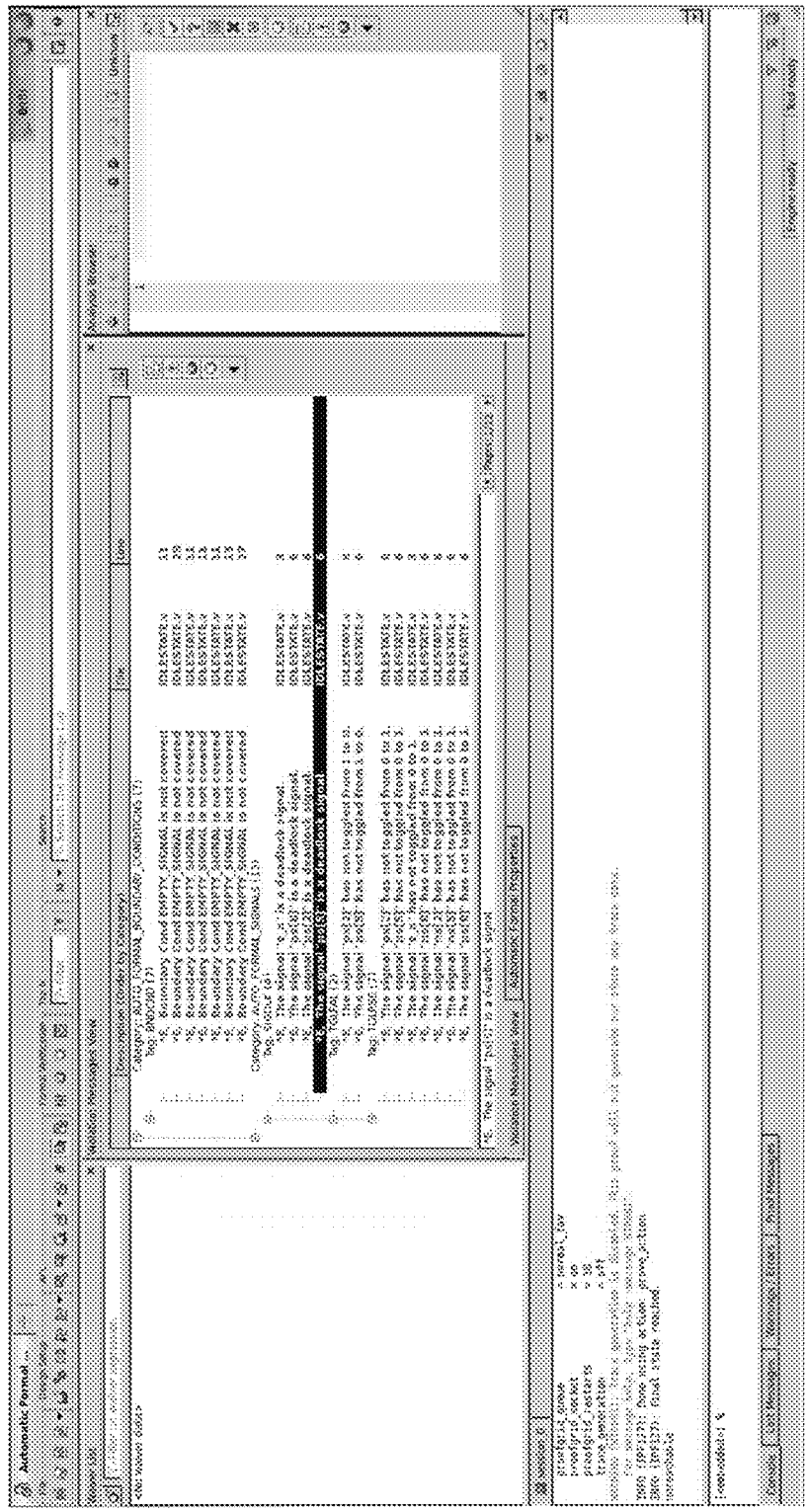
FIG. 7 is a diagram depicting an embodiment in accordance with the present disclosure.

FIG. 6-7 show example GUIs 600, 700 that display an automatic formal properties viewing option and a violation messages option respectively.

It should be noted that although portions of the present disclosure discuss ranking with respect to formal properties, embodiments included herein may be directed towards RTL designer signoff, which may include linting (e.g., basic and dft structural checks) as well as formal properties, and the ranking may apply to all violations. In other words, embodiments included herein are not intended to be restricted to formal properties alone.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:
receiving, using at least one processor, an electronic design;
performing formal verification upon at least a portion of the electronic design;
identifying one or more violations associated with the formal verification;
ranking the one or more violations, based upon, at least in part, one or more user-selectable variables, wherein the one or more user-selectable variables include at least one of incidence across type and incidence across instance, wherein incidence across type refers to a number of violations of a given type impacting a future ranking of violations of the given type and incidence across instance refers to a number of violations from a given instance impacting a future ranking of violations of the given instance;
displaying, at a graphical user interface, the one or more violations in a ranked order.

2. The computer-implemented method of claim 1, wherein ranking includes applying a weight to each of the one or more user-selectable variables prior to the ranking.

3. The computer-implemented method of claim 1, wherein displaying includes displaying at least one of an automatic formal properties view or a violation messages view.

4. The computer-implemented method of claim 1, wherein the one or more user-selectable variables include waiver learning or group size.

5. The computer-implemented method of claim 1, wherein the one or more user-selectable variables include at least one of severity or criticality.

6. The computer-implemented method of claim 1, wherein ranking is based upon, at least in part, at least two of the one or more user-selectable variables.

7. A non-transitory computer-readable storage medium for electronic design verification, the computer-readable storage medium having stored thereon instructions that when executed by a machine result in one or more operations, the operations comprising:
receiving, using at least one processor, an electronic design;
performing formal verification upon at least a portion of the electronic design;
identifying one or more violations associated with the formal verification;
ranking the one or more violations, based upon, at least in part, one or more user-selectable variables, wherein the one or more user-selectable variables include at least one of incidence across type and incidence across instance, wherein incidence across type refers to a number of violations of a given type impacting a future ranking of violations of the given type and incidence across instance refers to a number of violations from a given instance impacting a future ranking of violations of the given instance;
displaying, at a graphical user interface, the one or more violations in a ranked order.

8. The computer-readable storage medium of claim 7, wherein ranking includes applying a weight to each of the one or more user-selectable variables prior to the ranking.

9. The computer-readable storage medium of claim 7, wherein displaying includes displaying at least one of an automatic formal properties view or a violation messages view.

10. The computer-readable storage medium of claim 7, wherein the one or more user-selectable variables include waiver learning or group size.

11. The computer-readable storage medium of claim 7, wherein the one or more user-selectable variables include at least one of severity or criticality.

12. The computer-readable storage medium of claim 7, wherein ranking is based upon, at least in part, at least two of the one or more user-selectable variables.

13. A system for electronic design verification comprising:
a computing device having at least one processor configured to receive an electronic design and to perform formal verification upon at least a portion of the electronic design, the at least one processor further configured to identify one or more violations associated with the formal verification and to rank the one or more violations, based upon, at least in part, one or more user-selectable variables, wherein the one or more user-selectable variables include at least one of incidence across type and incidence across instance, wherein incidence across type refers to a number of violations of a given type impacting a future ranking of violations of the given type and incidence across instance refers to a number of violations from a given instance impacting a future ranking of violations of the given instance, the at least one processor further configured to display, at a graphical user interface, the one or more violations in a ranked order.

14. The system of claim 13, wherein ranking includes applying a weight to each of the one or more user-selectable variables prior to the ranking.

15. The system of claim 13, wherein displaying includes displaying at least one of an automatic formal properties view or a violation messages view.

16. The system of claim 13, wherein the one or more user-selectable variables include waiver learning or group size.

17. The system of claim 13, wherein the one or more user-selectable variables include at least one of severity or criticality.

* * * * *